United States Patent [19]

Moghadam

[11] Patent Number: 5,426,076
[45] Date of Patent: Jun. 20, 1995

[54] DIELECTRIC DEPOSITION AND CLEANING PROCESS FOR IMPROVED GAP FILLING AND DEVICE PLANARIZATION

[75] Inventor: Farhad K. Moghadam, Los Gatos, Calif.

[73] Assignee: Intel Corporation, Santa Clara, Calif.

[21] Appl. No.: 88,903

[22] Filed: Jul. 8, 1993

Related U.S. Application Data

[63] Continuation of Ser. No. 730,674, Jul. 16, 1991, abandoned.

[51] Int. Cl.$^6$ ............................................. H01L 21/02
[52] U.S. Cl. ..................................... 437/238; 437/228
[58] Field of Search ................ 437/235, 238, 240, 228

[56] References Cited
FOREIGN PATENT DOCUMENTS
0109248  6/1985  Japan .

OTHER PUBLICATIONS

Mehta, et al.; "A single-Pass, In-Situ Planarization Process Utilizing TEOS for Double-Poly, Double-Metal CMOS Technologies"; IEEE 6th Int'l VMIC Conf.; Jun. 1989, pp. 80-88.

Marks, et al.; "In Situ Planarization of Dielectric Surfaces Using Boron Oxide"; IEEE 6th Int'l VMIC Conf.; Jun. 1989; pp. 89–95.

*Primary Examiner*—R. Bruce Breneman
*Assistant Examiner*—Matthew Whipple
*Attorney, Agent, or Firm*—Blakely, Sokoloff, Taylor & Zafman

[57] ABSTRACT

A method of forming a silicon dioxide layer ($SiO_2$) on a semiconductor substrate which fills gaps between surface features by means of applying, cleaning, and etching a series of layers of silicon dioxide. A layer of $SiO_2$ is deposited by plasma enhanced chemical vapor deposition of tetraethyl orthosilicate; and a second layer of $SiO_2$ is deposited thereon by thermal chemical vapor deposition. A series of etches are performed, removing the second layer of $SiO_2$ from all regions of the substrates except the gaps. A third layer of $SiO_2$, formed by plasma enhanced chemical vapor deposition, is then deposited. An additional etch step further planarizes the surface of the substrate.

28 Claims, 4 Drawing Sheets

DIELECTRIC DEPOSITION AND CLEANING PROCESS FOR IMPROVED GAP FILLING AND DEVICE PLANARIZATION

This is a continuation of application Ser. No. 07/730,674, filed Jul. 16, 1991, now abandoned.

BACKGROUND OF THE INVENTION

1. Field of the Invention

This invention relates to the field of semiconductor devices and more specifically to a process for forming a silicon dioxide ($SiO_2$) interlevel dielectric layer on a semiconductor substrate, which fills gaps or cavities in the surface of the substrate to create a uniform planar surface over those gaps or cavities.

2. Prior Art

In the manufacture of semiconductor devices, there is a need to make electrical contact to certain regions of the surface of the substrate. Normally, a series of dielectric layers are formed on the surface of the silicon substrate which overlie the regions to be contacted. In order to expose these regions, an opening or via in the dielectric is formed. First, a photoresist mask which exposes the dielectric above the region to be contacted is formed. Next, the dielectric layer is etched to form a via which exposes the portions of the substrate to be contacted. Next, a layer of conductive material is deposited on the surface of the silicon substrate covering any overlying dielectric as well as regions exposed by openings in the dielectric, filling the vias. The conductive material is then covered with photoresist which is then patterned to cover the vias and what will be the "interconnects" or "interconnect lines". An etch step is then performed to remove the conductive material from the regions not covered, thereby leaving the conductive material in the vias as well as forming the interconnects. The interconnects electrically connect different device areas on the substrate and allow for electrical contact to external leads. Traditionally, sputtered aluminum (Al) has been used as the conductive material. Alternatively, a via fill step, whereby the via is filled with a conductive material such as a refractory metal or refractory metal silicide, is performed before the deposition of a top layer of aluminum, which is then patterned and etched to form interconnects.

In the manufacture of a semiconductor chip, many layers of dielectric material are generally applied to the semiconductor surface. A variety of methods and chemicals are used to form these dielectric films. One type of insulating film is formed by oxidation of tetraethyl siloxane (($SiOC_2H_5$)$_4$, more commonly known as tetraethyl orthosilicate (TEOS)) to form a $SiO_2$ film on the semiconductor surface. Various methods can be used to oxidize TEOS so as to form silicon dioxide layers on semiconductor surfaces.

One of the best methods for deposition of TEOS films is known as chemical vapor deposition. This process forms a solid film on the substrate by the reaction of vapor phase chemicals on the semiconductor surface. Chemical vapor deposition processes are preferred over other methods because they are more economical and because they allow for easy control over the deposition process. Chemical vapor deposition methods give a high purity of deposited material. A great variety of chemical compositions can be deposited using chemical vapor deposition, some of which cannot be deposited with adequate film properties by any other method.

Chemical vapor deposition processes use a reaction chamber into which the semiconductor wafer is placed. A given composition of reactive gases and inert gases are introduced into the reaction chamber. Upon reaction, these gases move onto the surface of the substrate. The reactive gases are then absorbed onto the substrate, migrating and undergoing film forming chemical reactions. Byproducts of the reaction are then removed from the reaction chamber by a vacuum. The energy which drives the reaction can be supplied by thermal methods, protons, or electrons.

Tetraethyl orthosilicate or TEOS is a material which is often used in chemical vapor deposition processes to form an $SiO_2$ film to be used as a insulator on semiconductor devices. TEOS is used to produce a silicon dioxide film in both thermal chemical vapor deposition (THCVD) and plasma enhanced chemical vapor deposition (PECVD) processes.

THCVD is a thermally activated deposition process which is usually performed at or near atmospheric pressure. The use of THCVD TEOS to deposit silicon dioxide layers gives excellent step coverage, and the deposited silicon dioxide tends to fill in cavities and gaps between projecting surface features. Step coverage is determined by taking the minimum thickness of a deposited layer along a vertical substrate surface and comparing that thickness to the thickness of the deposited layer on the horizonal surface. The closer the vertical thickness is to the horizonal thickness, the better the step coverage. Disadvantages of THCVD methods include low deposition rates and high porosity of silicon dioxide formed by THCVD TEOS. Because of this high porosity, $SiO_2$ formed by THCVD TEOS absorbs water during wet processing steps. This water, absorbed into the $SiO_2$ pores will outgas during subsequent high temperature steps. THCVD TEOS cannot be used to deposit a $SiO_2$ layer directly over interlevel metal layers because it will not adhere to the metal. Additionally, the THCVD process creates a high level of tensile stress in the metal which can cause the metal to crack.

Plasma Enhanced Chemical Vapor Deposition (PECVD) methods can also be used to deposit layers of $SiO_2$ film. PECVD methods for applying TEOS give fast deposition rates and good step coverage. PECVD methods use a rf-induced glow discharge to transfer energy to the reactive gases. Silicon dioxide layers formed by PECVD TEOS are not highly porous, thus they do not outgas during high temperature steps. In prior art processes the semiconductor wafer is removed from the PEVCD reaction chamber before the deposition of subsequent $SiO_2$ layers. Removal of the semiconductor wafer from the PEVCD reaction chamber will generally dry out or evaporate any accumulation of liquid TEOS which may remain on the wafer surface. Thus, accumulation of liquid TEOS on the wafer surface after PECVD processes has not generally been a problem in prior art processes.

When applying dielectric layers it is desirable to create a uniform surface, as close to a level, planar surface as possible, so as to facilitate the coverage of subsequent layers. In order to develop a uniform surface it is necessary to fill gaps between any protruding surface features. These surface features include devices, interconnect lines and interlevel metal layers. Though subsequent layers decrease the severity of these features, the cavities between features must be filled to obtain a uniform surface.

Due to the increasing density of VLSI devices the number of devices and surface features on any given semiconductor surface will continue to increase. This increase in the number of devices and surface features dictates that surface features must be spaced closer together, creating gaps between features of 1 micron or less. This close spacing creates highly irregular surfaces. When an $SiO_2$ layer is deposited over these closely spaced gaps, the $SiO_2$ will often from a thicker layer on the upper portions of the walls of the gap, causing the walls of the gap to meet during deposition. This creates a void in the bottom of the gap. The void will either contain gas or will be filled with moisture in subsequent wet processing steps. Upon later thermal processing steps, the moisture or the gas contained in the void expands, damaging the devices and the adjoining surface features.

$SiO_2$ formed by PECVD TEOS cannot be used to fill gaps because it does not have sufficient step coverage. Deposition of TEOS by PECVD methods leaves gaps and cavities between surface features. $SiO_2$ formed by THCVD TEOS can be used to fill cavities between surface features because $SiO_2$ formed by THCVD TEOS gives better step coverage. Though it is good at filling gaps and cavities, it is porous. Subsequent processing generally includes at least one wet process step. In this step, water is absorbed into the pores of the silicon dioxide surface formed by THCVD TEOS. This water evaporates when layers of conductive material are deposited at high temperature causing outgassing. Upon via fill this outgassing causes irregularities in the filling metal and poor adhesion between the conductive material and the surface of the substrate. This phenomenon is known as "via poisoning."

One method for gap filling involves a series of PECVD TEOS $SiO_2$ fills, each followed by an argon etch. The argon etch will remove more material from the upper sides of a cavity than from the bottom of the cavity. Thus, a series of etches and fills can be used to fill the cavity. But this process is slow and expensive, involving a large number of depositions and etches.

Other manufacturers of semiconductor devices use Spun-On-Glass (SOG) to fill gaps. SOG is applied over a layer of $SiO_2$, formed by PECVD using silane chemistry ($SiH_4$), in a series of steps, each of which deposits a thin layer of SOG which must then be baked and cleaned before the next layer is applied. After all layers are applied, a single plasma etch (based on flourine chemistry) is generally used to remove excess SOG. A second layer of PECVD $SiO_2$ is usually deposited over the SOG. The use of SOG to fill gaps has been successful for gaps of 1 $\mu$m and greater. When these gaps between surface features are less than 1 $\mu$m, subsequent thermal processing steps will cause the SOG to crack and separation between layers will be observed. SOG will not flow into a cavity having an opening less than or equal to 0.3 $\mu$m. Even if SOG were to flow into the cavity, the SOG would crack in subsequent thermal processing steps.

What is needed is a process for deposition of dielectric layers which will fill surface irregularities but will not create outgassing upon the via fill step. Preferably, this process for depositions of dielectric layers would be performed in one reaction chamber so as to avoid the addition of particulate contaminants to the wafer surface and to cut down processing time and expense.

SUMMARY OF THE INVENTION

The present invention describes a process for applying and etching layers of $SiO_2$ formed by plasma enhanced chemical vapor deposition (PECVD) and thermal chemical vapor deposition (THCVD) of tetraethyl orthosilicate (TEOS) as to fill surface irregularities and create a uniform dielectric surface. The present invention is practiced without removing the substrate from the reaction chamber until processing is completed. The process avoids the problem of poor metal adhesion and irregular fill during deposition of conductive layers, and avoids problems associated with the cracking of SOG layers.

The currently preferred embodiment of the process consists of seven steps. Each of these seven steps can be performed in the same reaction chamber. In the first step, a layer of $SiO_2$ is applied by PECVD TEOS over the exposed silicon substrate. The deposition of a layer of $SiO_2$ formed by PECVD TEOS will leave deposits of liquid TEOS on the surface of the $SiO_2$ layer. If a second layer of $SiO_2$ is deposited over the liquid TEOS deposits, these deposits of liquid TEOS will create defects which are known as "star defects." To eliminate this problem, an oxygen plasma clean step is performed. This clean step will remove the deposits of liquid TEOS formed by PECVD TEOS. In the third step, a layer of $SiO_2$ formed by THCVD TEOS is applied. This layer of $SiO_2$ tends to fill gaps and cavities between components and interconnects. In the forth step, the uppermost levels of the $SiO_2$ are etched back using Oxygen ($O_2$) and Carbon Tetraflouride ($CF_4$) as etching chemicals. A fifth step further etches the surface using Argon (Ar) and $CF_4$. These etch steps will remove all of the $SiO_2$ formed by THCVD TEOS which overlies the flat portions of the surface, as well as a portion of the underlying $SiO_2$ formed by PECVD TEOS. However, the voids and cavities of the surface will remain filled with $SiO_2$ formed by THCVD TEOS. In the sixth step a layer of $SiO_2$ formed by PECVD TEOS is applied to overlie both the $SiO_2$ formed by THCVD TEOS and the remaining $SiO_2$ formed by PECVD TEOS on the surface of the wafer. The seventh step uses a $O_2$ and $CF_4$ etch to further planarize the $SiO_2$ surface and to decrease the thickness of the dielectric $SiO_2$ layers.

DETAILED DESCRIPTION OF THE INVENTION

An invention is described for the formation of a silicon dioxide ($SiO_2$) insulating layer on the surface of a semiconductor substrate so that gaps between surface features may be uniformly filled with dielectric material. In the following description, numerous specific details are set forth such as specific thicknesses, pressures, powers, and flow rates, etc. in order to provide a thorough understanding of the present invention. It will be obvious, however, to one skilled in the art that the present invention can be practiced without these specific details. In other instances, well-known process steps have not been described in detail in order not to unnecessarily obscure the present invention.

Figure 1:
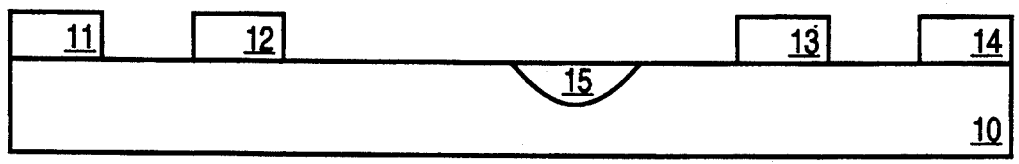
FIG. 1 shows a cross-sectional elevational view of a substrate with metal layers.

FIG. 1 shows semiconductor substrate 10 with interlevel metal layers 11–14. FIG. 1 also shows device region 15. Device region 15 can be, for example, a source or a drain. In addition to interlevel metal layers 11–14, the present invention can be used to fill gaps between any type of structure or device on the semiconductor surface. Interlevel metal layers are often made from a refractory metal, a silicide, or aluminum. These metal layers may be formed using well-known prior art techniques. There may be any number of interlevel metal layers or other structures on a given semiconductor substrate.

Figure 2:
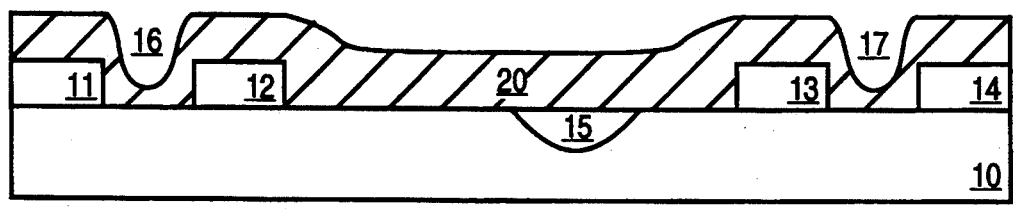
FIG. 2 illustrates the structure of FIG. 1 with a layer of $SiO_2$ formed by PECVD TEOS thereon.

The first process step requires the deposition of a layer of $SiO_2$ by PECVD TEOS. FIG. 2 shows the silicon substrate of FIG. 1 after the deposition of layer 20 of $SiO_2$ formed by PECVD TEOS. The thickness of the layer 20 is approximately 0.3 to 0.5 $\mu$m, preferably approximately 0.4 $\mu$m in the currently preferred embodiment. The application of $SiO_2$ formed by PECVD TEOS is performed in the currently preferred embodiment by flowing approximately 500–700 standard cubic centimeters per minute (SCCM) of oxygen and approximately 600–800 SCCM of TEOS vapor into a reaction chamber containing a semiconductor wafer. The TEOS may be vaporized by flowing an inert gas such as helium through an ampule of liquid TEOS which is heated to a temperature in the range of 35° C. to 45° C. Both the helium and the TEOS vapor will flow into the process chamber. The inert gas is known as the "carrier gas". The TEOS vapor is subjected to a rf-induction source powered at approximately 400–480 watts. A pressure of approximately 8–10 torr is maintained in the reaction chamber. The spacing between the rf-induction source and the susceptor (the receptacle upon which the semiconductor substrate rests) is generally 170–200 mils (1 mil=0.001 inch). The substrate is heated to a temperature between 380° C. and 400° C., the temperature of the currently preferred embodiment being 390° C. These parameters will give a deposition rate of approximately 7,000–9,000 Å per minute of $SiO_2$ formed by PECVD TEOS. Deposition of $SiO_2$ by PECVD TEOS gives poor step coverage; therefore, depositions of $SiO_2$ by PECVD TEOS tend to leave cavities between raised surface structures. Cavities 16 and 17 are examples of cavities on the semiconductor surface after the deposition of layer 20 of $SiO_2$ by PECVD TEOS.

The deposition of the PECVD TEOS layer will leave deposits or "islands" of liquid TEOS on the $SiO_2$ surface. If a second layer of TEOS is applied over these islands of liquid TEOS, the liquid TEOS will react with the ozone which flows into the reaction chamber, creating star defects. One with skill in the art would realize that star defects would occur in any subsequent in-situ process which involves the use of atomic oxygen. To eliminate this problem, the islands of liquid PECVD TEOS are removed by an oxygen plasma clean step.

In the second process step, an oxygen plasma is used to remove the islands of liquid TEOS from the surface of layer 20. The oxygen plasma clean is performed by flowing oxygen gas into the reaction chamber at approximately 50–75 SCCM. The clean is preferably performed at a pressure less than or equal to 1 Torr. The plasma is generated by a source spaced approximately 800–900 mils from the susceptor, at a power in the range of 200–250 watts. This low power is used to minimize chemical reactions between the $O_2$ and the TEOS surface. The flow of oxygen plasma contacts the liquid TEOS, removing the TEOS particles from the surface and charging the TEOS particles. The charged TEOS particles are then purged from the chamber by the gas flow and vacuum. Though the use of oxygen gas is described in the plasma clean step, one with skill in the art would realize that any heavy molecular gas could be used. Other gasses which could be used include argon and nitrogen.

Figure 3:
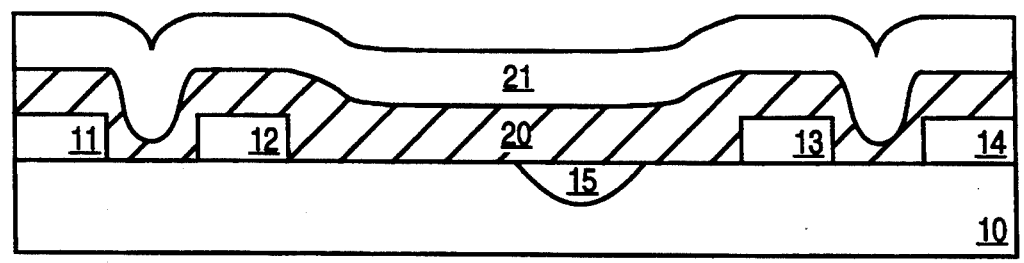
FIG. 3 illustrates the structure of FIG. 2 after a layer of $SiO_2$ formed by THCVD TEOS has been deposited thereon.

The third process step is that of depositing a layer of $SiO_2$ formed by THCVD TEOS. FIG. 3 shows the structure of FIG. 2 after deposition of layer 21 of $SiO_2$ formed by of THCVD TEOS. The depositional characteristics of THCVD TEOS are such that it tends to fill in cavities 16 and 17 and any nonuniformities on the depositional surface. The THCVD TEOS process for depositing $SiO_2$ directly on top of metal layers gives poor adhesion to the metal and can crack the metal. In the present invention this problem is avoided because $SiO_2$ layer 20, which was formed by PECVD TEOS, will cover interlevel metal layers 11–14. Therefore, layer 21 will not contact any metal surfaces. $SiO_2$ layer 21 is deposited to a sufficant thickness so as to fill all of the surface cavities and nonuniformities. The thickness of $SiO_2$ layer 21 is generally from 0.4 $\mu$m to 0.6 $\mu$m thick, and is approximately 0.5 $\mu$m in the currently preferred embodiment. The formation of a layer of $SiO_2$ by THCVD TEOS is generally performed by flowing approximately 1,100–1,200 SCCM of ozone gas and approximately 800–900 SCCM of TEOS vapor into the reaction chamber containing the semiconductor wafer. The TEOS is vaporized using an inert gas such as helium which flows through an ampule of liquid TEOS which is heated to a temperature of about 35° C. to 45° C. Both helium gas and TEOS vapor will then flow into the process chamber. The reaction chamber is maintained at a pressure of approximately 70–90 torr. The platform on which the substrate is held is heated using a set of heat lamps separated from the reaction chamber by a quartz wall. This heat source will heat the susceptor to a temperature of 380° C. to 400° C. The temperature of the currently preferred embodiment is approximately 390° C. These parameters will give a deposition rate of approximately 2,500–3,000 Å per minute.

Figure 4:
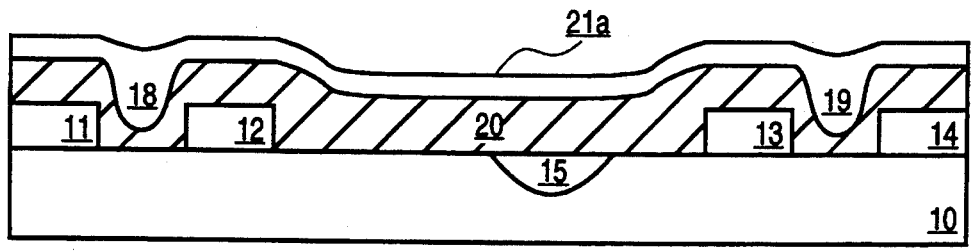
FIG. 4 illustrates the structure of FIG. 3 after the first etch step.

The forth process step is an etch-back of the top $SiO_2$ layer. FIG. 4 shows the silicon substrate of FIG. 3 after layer 21 has been etched, forming layer 21a. The etch step uses carbon tetraflouride ($CF_4$) gas and oxygen ($O_2$) gas to etch $SiO_2$ layer 21a. Oxygen gas is flowed at a rate of approximately 40–60 SCCM, the currently preferred embodiment having a rate of 50 SCCM. The oxygen is mixed with a flow of CF$_4$, the CF$_4$ flowing at a rate of 80-120 SCCM, the currently preferred embodiment having a rate of approximately 100 SCCM. Once the two gasses are mixed, they flow into the reaction chamber. In the currently preferred embodiment 500-600 watts of power are applied to the rf-induction source at room temperature, and the chamber is maintained at a pressure of 0.3-0.4 torr. The oxygen and carbon tetraflouride will react with the SiO$_2$ surface, etching at a rate of approximately 7,000-8,500 Å per minute. The surface is preferably etched to a depth of approximately 0.45 μm. The O$_2$ and CF$_4$ etch is a selective etch, the SiO$_2$ formed by THCVD TEOS being etched at a faster rate than that of the SiO$_2$ formed by PECVD TEOS. After this etch a small layer of SiO$_2$ formed by THCVD TEOS (layer 21a) remains on the surface of the substrate as well as in the gaps and cavities. One with skill in the art would realize that other gasses could be used to perform the etch step and that the gasses used in the etch step may be doped.

Figure 5:
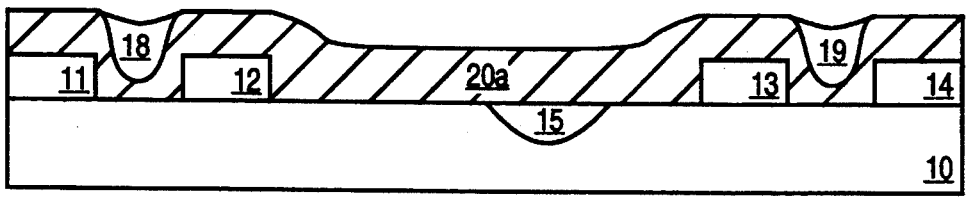
FIG. 5 illustrates the structure of FIG. 4 after the second etch step.

The fifth step is an etch step to remove the remaining SiO$_2$ formed by THCVD TEOS from the flat surface area of substrate 10. The second etch is a non-selective etch. Argon gas is used because it is non-selective. In this step a mixture of Ar and CF$_4$ gasses are used to etch an additional 0.1 μm from the SiO$_2$ surface. FIG. 5 shows the silicon substrate and SiO$_2$ layers remaining after the second etch step. Layer 21a from FIG. 4 has been etched so that only the SiO$_2$ deposited in gaps or cavities 16 and 17 remains, this SiO$_2$ forming "fill" areas 18 and 19. This etch step will etch approximately 0.05 μm from SiO$_2$ layer 20, forming layer 20a. This overetch will assure that all of SiO$_2$ layer 21a is removed from the flat portious of the semiconductor surface. Argon gas is difficult to use for etching because it gives a non-uniform etch. To overcome this non-uniformity, the currently preferred embodiment forms an electromagnetic field of approximately 60-70 gause around the semiconductor wafer. This field is rotated during the Ar and CF$_4$ etch so as to provide a uniform etch. This etch is performed at a lower power, 400-450 watts of power being applied to the rf-induction source. Argon gas is flowed at 40-60 SCCM, the currently preferred embodiment using a flow rate of approximately 50 SCCM. The Argon gas is mixed with a flow of CF$_4$, the CF$_4$ flowing at a rate of 80-120 SCCM, the currently preferred embodiment having a flow rate of 10 SCCM. The preferred embodiment currently uses a pressure of 0.03-0.04 torr. One with skill in the art would realize that other gasses could be used to perform the etch step and that the gasses used in the etch step may be doped.

Figure 6:
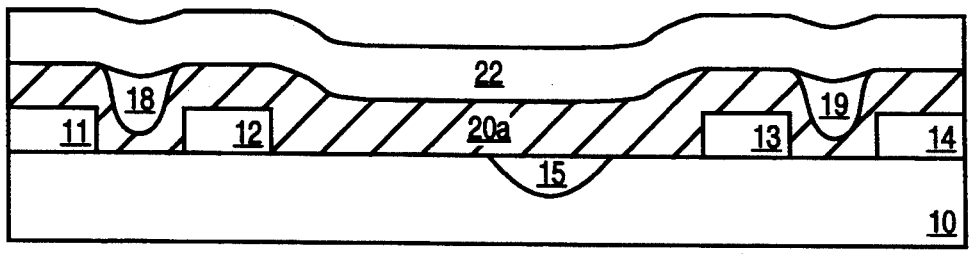
FIG. 6 illustrates the structure of FIG. 5 after a layer of $SiO_2$ formed by PECVD TEOS has been deposited thereon.

In the sixth step a third layer of SiO$_2$, formed by PECVD TEOS, is deposited over the semiconductor surface. FIG. 6 shows the etched surface of FIG. 5 after layer 22 of SiO$_2$ formed by PECVD TEOS has been deposited thereon. Because of cavity fill areas 18 and 19, the surface of the SiO$_2$ layer is relatively planar and areas overlying the prior cavities 16 and 17 of FIG. 2 exhibit little, if any surface irregularities. Layer 22 is generally from about 1.0-2.0 μm thick, and the currently preferred embodiment uses a thickness of approximately 1.8 μm. This third layer of SiO$_2$ caps the original cavities which are filled with SiO$_2$ formed by THCVD TEOS.

Figure 7:
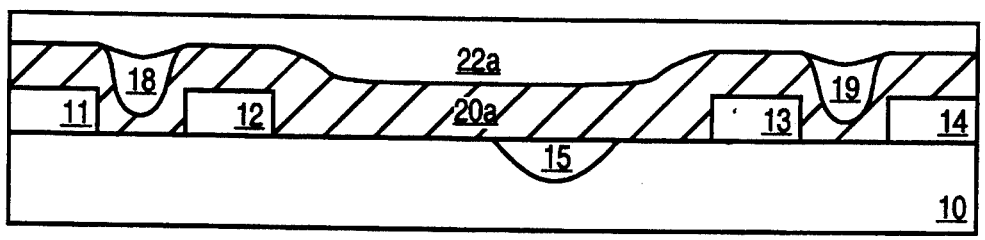
FIG. 7 illustrates the structure of FIG. 6 after a partial etch of the top $SiO_2$ layer has been performed thereon.

The seventh step is an etch to further planarize the SiO$_2$ surface and to decrease the total thickness of the dielectric SiO$_2$ layer. It is desirable to decrease the thickness of the dielectric SiO$_2$ layers because thinner layers allow shallower vias to be formed. Shallow vias are easier to etch and easier to fill. The etch is performed using O$_2$ and CF$_4$ gasses. FIG. 7 shows SiO$_2$ layer 22a formed by etching approximately 0.35 to 1.35 μm from layer 22, the currently preferred embodiement etching approximately 1.25 μm. Layer 22a is of a sufficient thickness so as to cover or "cap" SiO$_2$ fill areas 18 and 19. Oxygen gas is flowed into the reaction chamber at a rate of approximately 40-60 SCCM, the currently preferred embodiment having a rate of 50 SCCM. The oxygen is mixed with a flow of CF$_4$, the CF$_4$ flowing at a rate of 80-120 SCCM, the currently preferred embodiment having a rate of approximately 100 SCCM. In the currently preferred embodiment 500-600 watts of power are applied to the rf-induction source at room temperature, and the chamber is maintained at a pressure of 0.3-0.4 torr. The oxygen and carbon tetraflouride will react with the SiO$_2$ surface, etching at a rate of approximately 7,000-8,500 Å per minute.

Figure 10:
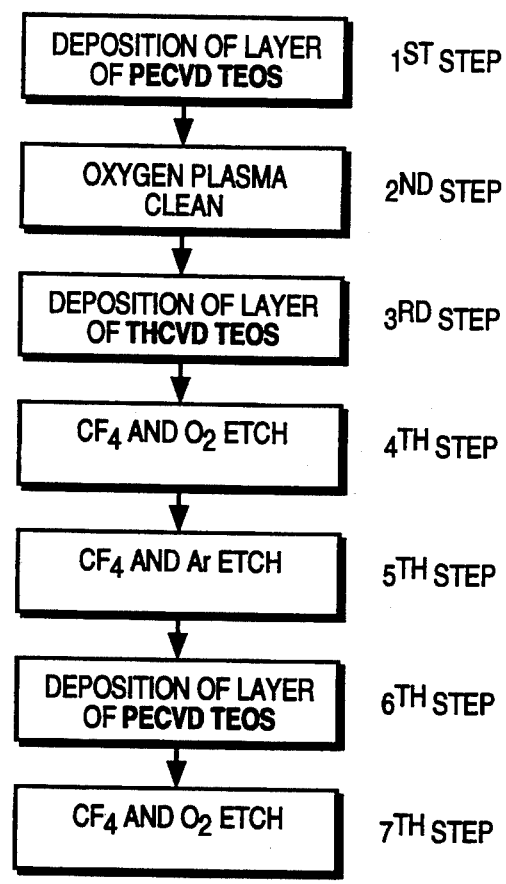
FIG. 10 illustrates the steps in the preferred embodiment of the novel dielectric deposition and etching process.

FIG. 10 illustrates each of the steps in the currently preferred embodiment of the present invention. It should be obvious to one skilled in the art that variations in the process are possible. For instance, it would be obvious to one skilled in the art that process step 7 could be omitted and SiO$_2$ layer 22 could be deposited to a thickness of approximately 0.450-0.65 μm. This would create a less planar surface but would avoid the time and expense of process step 7. Also, etch steps 4 and 5 could be combined into one etch step and different gasses could be used to perform any of the various etch steps.

Figure 8:
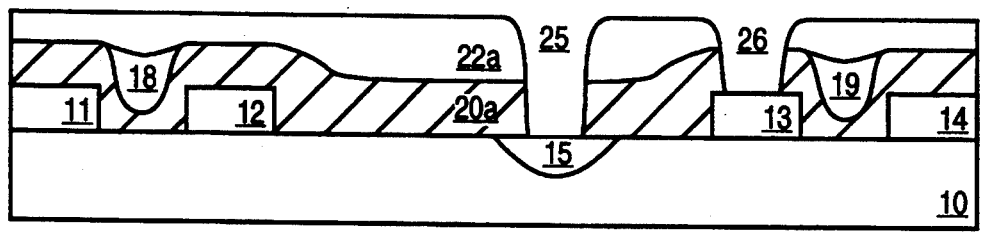
FIG. 8 illustrates the structure of FIG. 7 with contact openings or vias etched therein.
Figure 9:
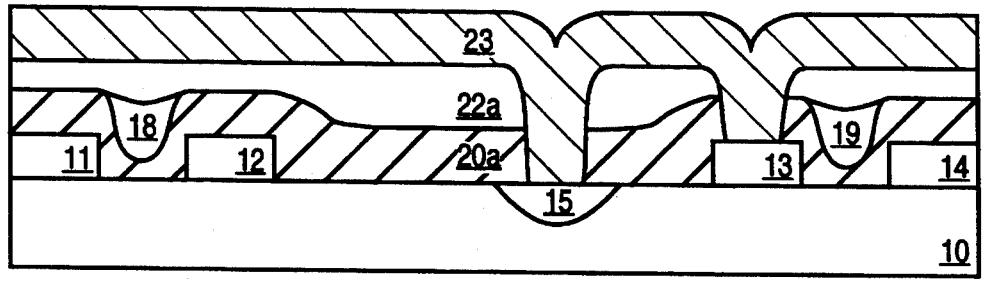
FIG. 9 illustrates the structure of FIG. 8 after the deposition of a metal layer thereon.

In the subsequent process steps, the SiO$_2$ is masked and etched to form contact openings or vias. FIG. 8 shows the substrate of FIG. 7 after contact openings or vias 25 and 26 have been etched into dielectric layers 20a and 22a. The mask and etch through the SiO$_2$ is made by methods well-known to those skilled in the art. A typical semiconductor surface may have any number of these contact openings etched into it. Next, a layer of conductive material is deposited over the semiconductor surface by a process well-known to those skilled in the art. FIG. 9 shows the deposition of metal layer 23 on top of layer 22a. This layer will fill the contact openings 25 and 26 to make electrical contact between interlevel metal layer 13 and device region 15. Typically, sputtered aluminum has been used as a conductive material but other materials could also be employed. In the present invention, SiO$_2$ formed by the THCVD TEOS process remains only in the gaps and not in the regions through which vias will be formed. Therefore, the side walls of vias 25 and 26 do not expose SiO$_2$ formed by THCVD TEOS. Because there is no exposed SiO$_2$ formed by THCVD TEOS to outgas during subsequent processing steps, the problem of outgassing is avoided, giving good adhesion and uniform fill of conductive material.

Thus, a process is described for forming an interlevel dielectric. The interlevel dielectric fills gaps and cavities on the surface of the substrate, forming a planar upper surface. The dielectric layer is formed such that SiO$_2$ formed by THCVD TEOS is not exposed during subsequent high temperature processing steps. Additionally, all processing is carried out in a single system without the need to remove the substrate between processing steps.

I claim:

1. A process for forming a dielectric layer on a semiconductor surface, said surface having structures formed thereon, said structures having gaps formed therebetween, said process comprising the steps of:
   depositing a first layer of silicon dioxide by PECVD TEOS;
   depositing a second layer of silicon dioxide by THCVD TEOS;
   etching said second layer of silicon dioxide from all regions of said dielectric layer in which openings are to be formed while leaving at least some of said second layer in said gaps to form an etched surface; and
   depositing a third layer of silicon dioxide formed by PECVD TEOS on said etched surface.

2. The process of claim 1 further comprising the step of performing a plasma dean on said first layer of $SiO_2$ before said deposition of said second layer.

3. The process of claim 2 wherein said plasma clean is performed by flowing 50–70 standard cubic centimeters per minute of oxygen into a reaction chamber having a plasma generating rf source powered at 200 to 250 watts.

4. The process of claim 1 wherein the thickness of said first layer of silicon dioxide is 0.3–0.5 μm, the thickness of said second layer of silicon dioxide is in the range of 0.4–0.6 μm, and the thickness of said third layer of silicon dioxide is in the range of 0.3–0.5 μm.

5. The process of claim 1 wherein said etch step etches from 0.4 μm to 0.8 μm of $SiO_2$.

6. The process of claim 1 wherein said etch step is performed using a first etch using a gas mixture comprising oxygen gas and carbon tetraflouride gas, and a second etch using a gas mixture comprising carbon tetraflouride and argon gas.

7. The process of claim 6 wherein said first etch is performed at a pressure of 0.3–0.5 torr, at a power of 500–600 watts, with an oxygen flow rate of 40–60 SCCM and a carbon tetraflouride flow rate of 80–120 SCCM, and said second etch is performed at a pressure of 0.03–0.04 torr, at a power of 400–450 watts, with an argon flow rate of 40–60 SCCM and a carbon tetraflouride flow rate of 5–15 SCCM.

8. The process of claim 1 wherein said third layer of $SiO_2$ is deposited to a thickness exceeding 0.3 μm and said process further comprises the step of performing an etch on said third layer such that the thickness of said third layer after said etch is in the range of 0.3–0.6 μm.

9. The process of claim 8 wherein said third layer is etched using a gas mixture comprising oxygen gas and carbon tetraflouride gas at a pressure of 0.3–0.5 torr, and at a power of 500–600 watts, with an oxygen flow rate of 40–60 SCCM, and a carbon tetraflouride flow rate of 80–120 SCCM.

10. The process of claim 1 wherein said third layer of $SiO_2$ is deposited to a thickness of approximately 1.0–2.0 μm and wherein said etch step etches from 0.35–1.35 μm.

11. The process of claim 1 wherein all of said process steps are performed sequentially within the same reaction chamber, said semiconductor wafer not being removed from said reaction chamber between process steps.

12. In a process for depositing silicon dioxide on a semiconductor substrate, said process having at least one deposition of silicon dioxide formed by PECVD TEOS, an improvement comprising a plasma clean step after deposition of said $SiO_2$ layer formed by PECVD TEOS.

13. The process of claim 12 wherein said plasma clean is performed using a gas comprising oxygen.

14. The process of claim 12 wherein said plasma clean is performed using a gas comprising argon.

15. The process of claim 12 wherein said plasma clean is performed using a gas comprising nitrogen.

16. The process of claim 13 wherein the flow of said oxygen is 50–60 SCCM and said plasma clean is performed using a spacing between the susceptor and the rf-induction source of 800–900 mils, a power of less than 250 watts, and at a pressure of less than or equal to 1 torr.

17. The process of claim 12 wherein said plasma clean step is performed prior to the deposition of a second layer of $SiO_2$ deposited by chemical vapor deposition of TEOS.

18. The process of claim 12 wherein all of said process steps are performed sequentially within the same reaction chamber, said semiconductor substrate not being removed from said reaction chamber between said chemical vapor deposition process steps.

19. A process for forming a dielectric layer on a semiconductor substrate, said substrate having structures formed thereon, said structures having gaps formed therebetween, said process comprising the steps of:
   depositing a first layer of silicon dioxide by PECVD TEOS;
   depositing a second layer of silicon dioxide by THCVD TEOS;
   etching said second layer of silicon dioxide from all areas of said semiconductor substrate except said gaps;
   depositing a third layer of silicon dioxide foraged by PECVD TEOS on said etched surface.

20. The process of claim 19 further comprising the step of performing a plasma clean on said first layer of $SiO_2$ before said deposition of said second layer.

21. The process of claim 20 wherein said plasma clean is performed by flowing 50–70 standard cubic centimeters per minute of oxygen into a reaction chamber having a plasma generating rf source powered at 200 to 250 watts.

22. The process of claim 19 wherein the thickness of said first layer of silicon dioxide is 0.3–0.5 μm, the thickness of said second layer of silicon dioxide is in the range of 0.4–0.6 μm, and the thickness of said third layer of silicon dioxide is in the range of 0.3–0.5 μm.

23. The process of claim 19 wherein said etch step is performed using a first etch using a gas mixture comprising oxygen gas and carbon tetraflouride gas, and a second etch using a gas mixture comprising carbon tetraflouride and argon gas.

24. The process of claim 23 wherein said first etch is performed at a pressure of 0.3–0.5 torr, at a power of 500–600 watts, with an oxygen flow rate of 40–60 SCCM and a carbon tetraflouride flow rate of 80–120 SCCM, said second etch is performed at a pressure of 0.03–0.04 torr, at a power of 400–450 watts, with an argon flow rate of 40–60 SCCM and a carbon tetraflouride flow rate of 5–15 SCCM.

25. The process of claim 19 wherein said third layer of $SiO_2$ is deposited to a thickness exceeding 0.3 μm and said process further comprises the step of performing an etch on said third layer such that the thickness of said third layer after said etch is in the range of 0.3–0.6 μm.

26. The process of claim 25 wherein said third layer is etched by performing a plasma etch using a gas mixture comprising oxygen gas and carbon tetraflouride gas.

27. The process of claim 26 wherein said etch uses a pressure of 0.3-0.5 torr, a power of 500-600 watts, an oxygen flow rate of 40-60 SCCM and a carbon tetraflouride flow rate of 80-120 SCCM.

28. The process of claim 19 wherein all of said process steps are performed sequentially within the same reaction chamber, said semiconductor wafer not being removed from said reaction chamber between process steps.

* * * * *

UNITED STATES PATENT AND TRADEMARK OFFICE
CERTIFICATE OF CORRECTION

PATENT NO. : 5,426,076
DATED : June 20, 1995
INVENTOR(S) : Farhad K. Moghadam It is certified that error appears in the above-identified patent and that said Letters Patent is hereby corrected as shown below:

In column 9 at line 17 delete "dean" and insert --clean--

In column 10 at line 35 delete "foraged" and insert --formed--

Signed and Sealed this

Fifteenth Day of July, 1997

Attest:

BRUCE LEHMAN

*Attesting Officer*  *Commissioner of Patents and Trademarks*